United States Patent
Zhan et al.

(10) Patent No.: US 9,972,763 B2
(45) Date of Patent: May 15, 2018

(54) BI-STABLE MEMS CANTILEVER HEAT HARVESTER

(71) Applicant: Sharp Laboratories of America, Inc., Camas, WA (US)

(72) Inventors: Changqing Zhan, Vancouver, WA (US); Wei Pan, Vancouver, WA (US); Hao-Chih Yuan, Vancouver, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 357 days.

(21) Appl. No.: 15/017,609

(22) Filed: Feb. 6, 2016

(65) Prior Publication Data

US 2017/0229630 A1    Aug. 10, 2017

(51) Int. Cl.
*H01L 37/02* (2006.01)
*H02N 3/00* (2006.01)

(52) U.S. Cl.
CPC .............. *H01L 37/02* (2013.01); *H02N 3/00* (2013.01)

(58) Field of Classification Search
CPC .................................. H01L 37/02; H02N 3/00
See application file for complete search history.

(56) References Cited

PUBLICATIONS

Diankun Pan et al., "Piezoelectric energy harvester based on bi-stable hybrid symmetric laminate", Composites Science and Technology, vol. 119, Nov. 23, 2015, pp. 34-45.
Bimetal-and-electret-based thermal energy harvesters—Application to a battery-free Wireless Sensor Node—Boisseau, S, et al. arXiv:1310.4742.

*Primary Examiner* — Ramon M Barrera
(74) *Attorney, Agent, or Firm* — ScienBiziP, P.C.; Steve Reiss

(57) ABSTRACT

A bi-stable micro-electrical mechanical system (MEMS) heat harvester is provided. A bi-stable MEMS cantilever located between a hot temperature surface and a cold temperature surface, and is made up of a first MEMS material layer, having a first coefficient of thermal expansion. A second MEMS material layer is in contact with the first MEMS material layer, and has a second coefficient of thermal expansion less than the first coefficient of thermal expansion. A tensioner, made from a material having a tensile stress greater than the stress of the first or second MEMS materials, is connected to the cantilever. The heat harvester also includes a mechanical-to-electrical power converter, which may be a piezoelectric device or an electret device. The bi-stable MEMS cantilever may include a thermal expander having a coefficient of thermal expansion greater than the second coefficient of thermal expansion. The thermal expander is connected to the tensioner.

25 Claims, 12 Drawing Sheets

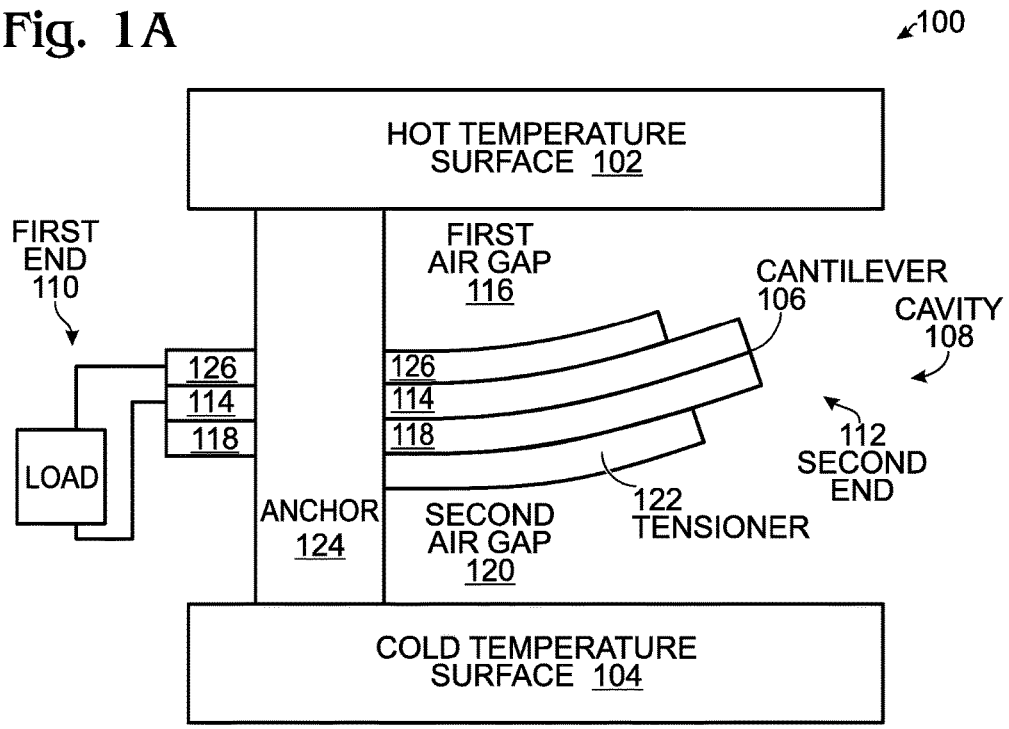
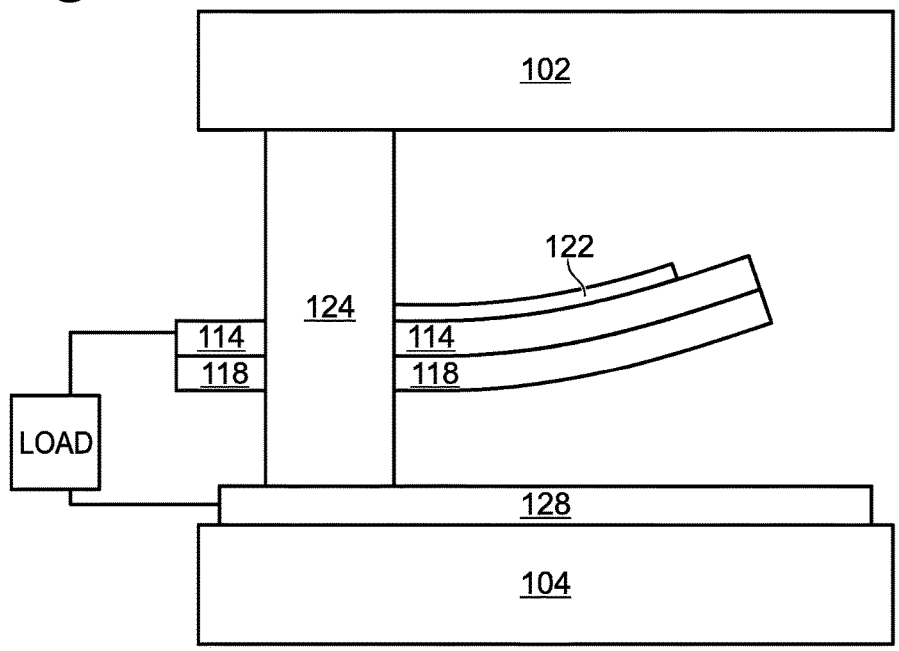

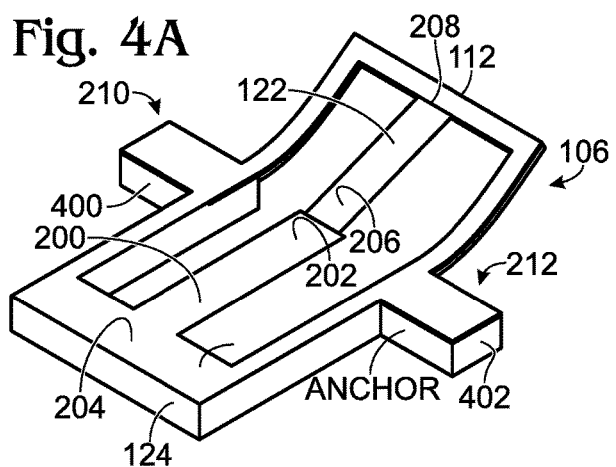
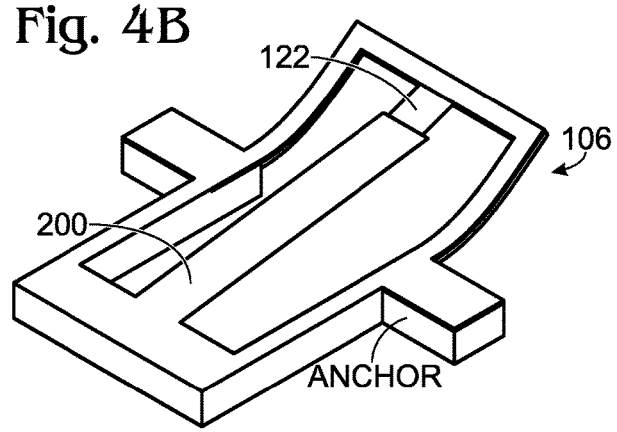
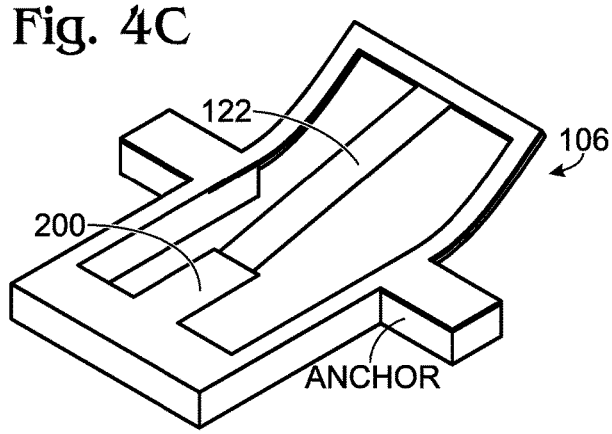

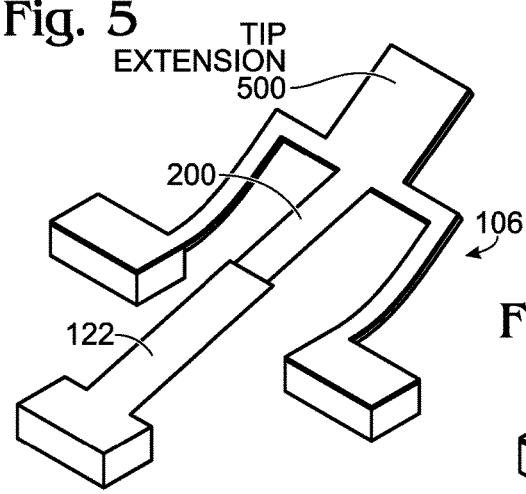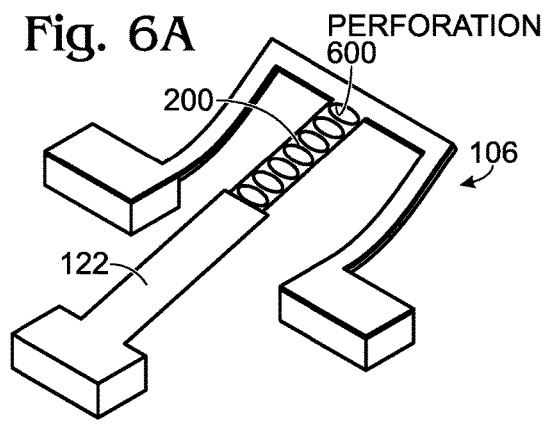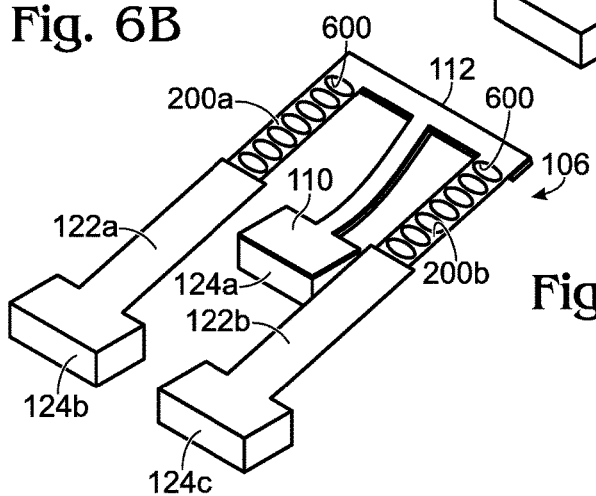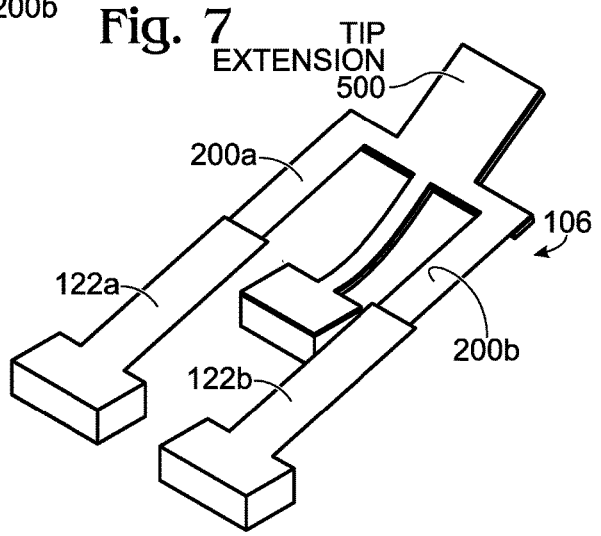

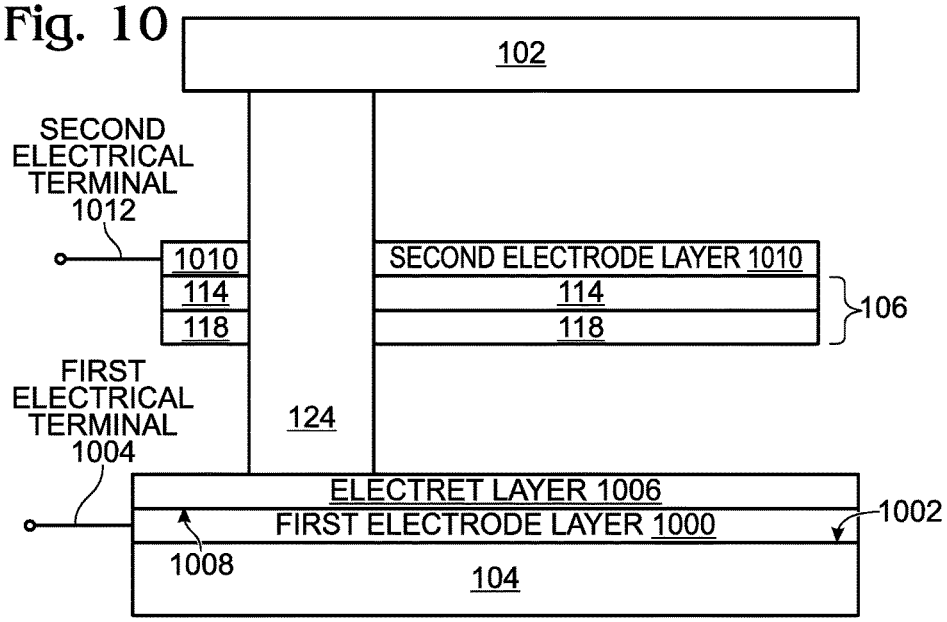
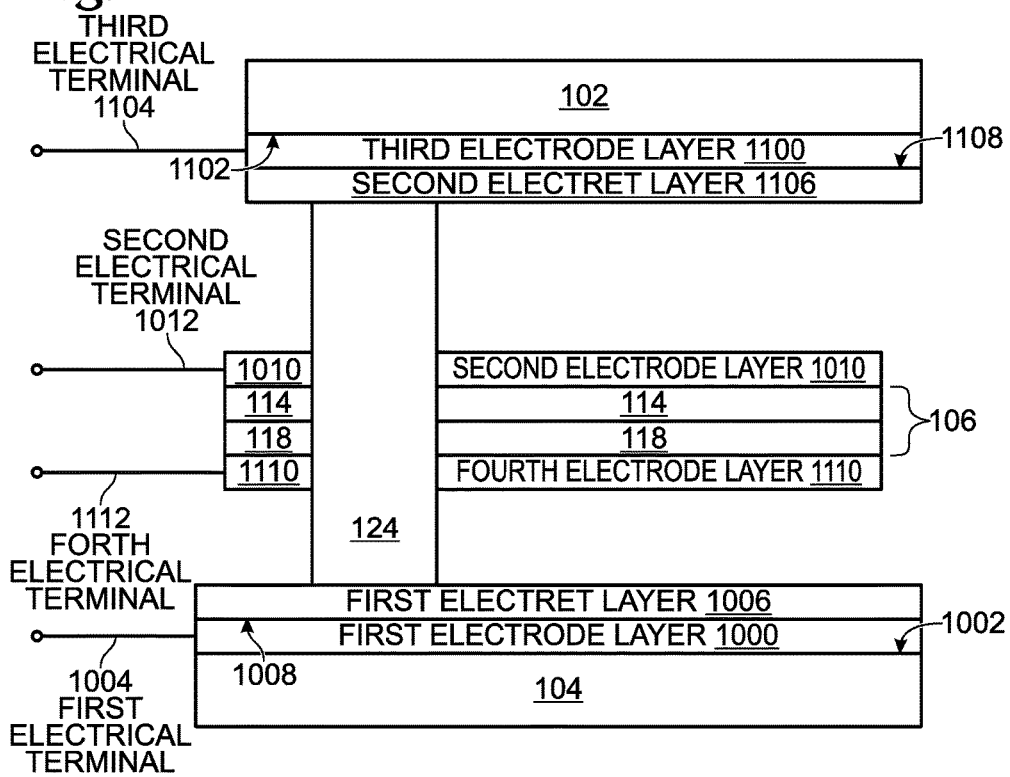

BASIC MEMS BIMORPH CANTILEVER

MEMS BI-STABLE CANTILEVER

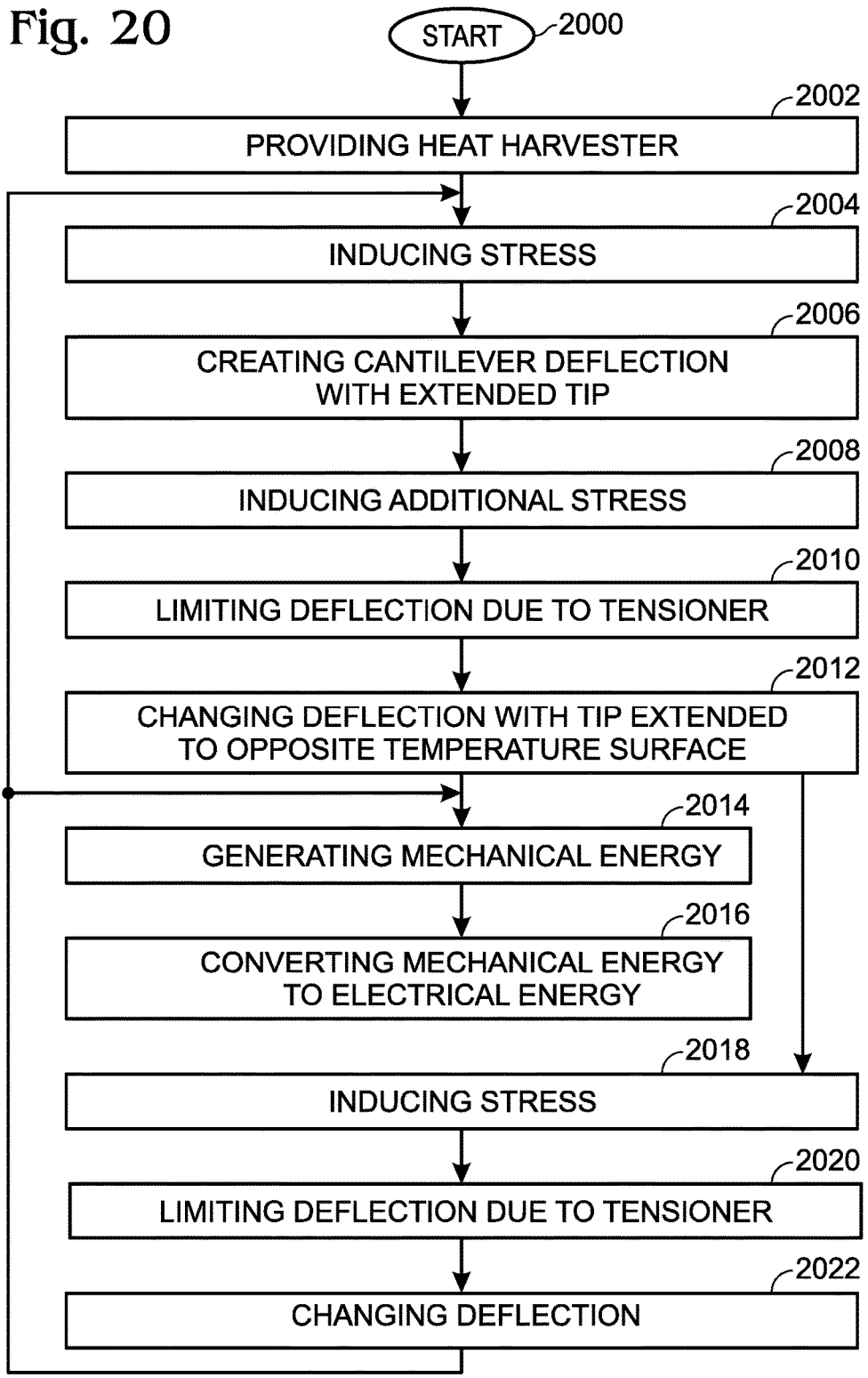

BI-STABLE MEMS CANTILEVER HEAT HARVESTER

BACKGROUND OF THE INVENTION

1. Field of the Invention

This invention generally relates to thin-film integrated circuits and, more particularly, to micro-electro mechanical system (MEMS) structures capable of converting thermal energy to electrical energy.

2. Description of the Related Art

Every year, billions of dollars' worth of energy is thrown away in the form of waste heat. For example, 25% of the energy generated from a car's combustion engine produces motion, and through the alternator, generates electricity to power electronic accessories. The remaining 75% of the energy is lost through heat. Significant efforts have been made in the study of heat harvesting, motivated by both the desire to address alleged climate change issues and the challenge of energy autonomy in wearable wireless transducer nodes.

Thermoelectric (TE) generators are the state of the art in heat harvesting technology, to directly convert heat to electricity. However, the technology still suffers from low conversion efficiency and high costs, due to the fact that rare earth materials (e.g., bismuth telluride) are required. Further, these materials have low thermal insulating properties. Other products are being developed. BMW recently announced the use of 24 TE modules on a car exhaust that generated 600 watts of electrical power under motorway driving conditions, which was 30% of car's electrical requirement. Currently, the typical conversion efficiency of a TE device is in the range of 10 to 20 microwatts per square centimeter ($uW/cm^2$). Any improvement on the conversion efficiency would result in significant module size reduction and cost savings.

Besides the waste heat from industries, cars, and household appliance, the human body readily generates heat on the average of 5.3 $mW/cm^2$. Converting human body heat to electricity is a very attractive concept, since it would enable self-powered wireless health monitoring technology, which could makes the system not only handy and autonomous, but also especially useful in emergencies and when help is difficult to reach. By using a thermoelectric generator attached to human body, some simple self-powered wearable wireless sensing systems have already been attempted. Apparently, the small temperature difference between the human body and ambient temperature, and the limited conversion efficiency of the TE devices, has as of yet made wearable wireless health monitoring systems impractical.

FIGS. 21A and 21B are, respectively, a cross-sectional view of a basic MEMS bimorph cantilever and a strain energy chart (prior art). The cantilever is composed of 3 materials: a high value coefficient of thermal expansion (CTE) upper film, a low value CTE lower film, and a low thermal conductivity material as anchor. In some aspects, the low value CTE film and anchor may be the same material. When heated, the cantilever bends downward due to the CTE mismatch at the interface of the upper film and lower film, and when cooling the cantilever moves back to its original position.

If arranged between a hot surface and a cold surface as illustrated, the MEMS bimorph cantilever vibrates as follows:

1. the cantilever is exposed to a heated surface and initially its tip touches the hot surface;
2. the body of cantilever is heated, the cantilever bends downward and, as a result, its tip separates from the hot surface and the heating stops;
3. as the cantilever cools down the downward bend is relaxed and the cantilever moves back to its original position;
4. the system returns to Step 1, and the next cycle begins.

Although a vibration can be established thermally, the very small deflection displacement implies that the induced strain energy is too low to be meaningful for energy harvesting, as depicted in the strain energy chart (FIG. 21B).

It would be advantageous if small thermal-to-electrical energy conversion devices could be made more efficient.

SUMMARY OF THE INVENTION

Disclosed herein is a heat harvesting technology that addresses the above-described challenges. Different from conventional thermoelectric (TE) techniques that use a direct heat-to-electricity conversion mechanism, which relies upon the properties of limited-supply rare earth materials, the technology described herein adopts an indirect heat-to-electricity conversion path, where heat is first converted into mechanical strain energy by inducing vibration in a bi-stable micro-electric mechanical system (MEMS) cantilever, which is then converted to electricity via an integrated electret or piezoelectric generator. A tension bar plays a key role on enabling the bi-stable MEMS cantilever to vibrate between its two stable positions, as a result of a temperature differential, with significant tip displacement. A thermally expandable bar in series with the tension bar realizes a self-adjusting mechanism to guarantee a thermally induced vibration between the bi-stable MEMS cantilever's two stable positions.

Accordingly, a bi-stable MEMS heat harvester is provided. The heat harvester has a hot temperature surface, a cold temperature surface, and a bi-stable MEMS cantilever located in a cavity between the hot temperature surface and the cold temperature surface. The bi-stable MEMS cantilever is made up of a first MEMS material layer, having a first coefficient of thermal expansion, separated from the hot temperature surface by a first air gap. A second MEMS material layer is in contact with the first MEMS material layer, and has a second coefficient of thermal expansion less than the first coefficient of thermal expansion. The second MEMS material layer is separated from the cold temperature surface by a second air gap. A tensioner, made from a material having a tensile stress greater than the stress of the first or second MEMS material layers, is connected to the cantilever. An anchor secures a first end of the cantilever, and is made from a material having a thermal conductivity lower than the thermal conductivity of the first MEMS material or tensioner material. The heat harvester also includes a mechanical-to-electrical power converter, which may be a piezoelectric device or an electret device. The thermal-to-mechanical power converter may be mounted on the bi-stable MEMS cantilever, the hot temperature surface, the cold temperature surface, or combinations thereof.

In one aspect, the bi-stable MEMS cantilever includes a thermal expander made from a material having a third coefficient of thermal expansion greater than the second coefficient of thermal expansion. The thermal expander is connected to the tensioner. The heat harvester can be enabled in a number of variations. For example, the bi-stable MEMS cantilever may be formed in a "U" shape with two legs, where the ends of the legs form the cantilever first end. The thermal expander is shaped as a bar with a first end and a second end, and the tensioner is shaped as a bar with a first end connected in series to the thermal expander first end. The combination of thermal expander and tensioner form a bar connected between the cantilever second end at the center of the "U" shape, and the anchor between the cantilever first end legs.

Also provided is a method for converting thermal-to-mechanical-to-electrical energy. The method provides a heat harvester as described above, with a hot temperature surface, a cold temperature surface, an anchored tensioner, and an anchored bi-stable MEMS cantilever comprising two MEMS material layers. The method induces stress in the bi-stable MEMS cantilever due to a difference in a coefficient thermal expansion between the two MEMS material layers and the influence of a first temperature surface, creating a deflection in the bi-stable MEMS cantilever with a tip of the hi-stable MEMS cantilever extending towards the first temperature surface in a first stable position. In response to the tip extending towards the first temperature surface, additional stress is induced in a center region of the bi-stable MEMS cantilever. But in response to the influence of the tensioner, the hi-stable MEMS cantilever deflection in the center region is limited. When the additional stress overcomes the limiting influence of the tensioner, a change in the deflection is created in the bi-stable MEMS cantilever with the tip of the bi-stable MEMS cantilever extending towards the second temperature surface in a second stable position. In response to the change in deflection, mechanical energy is generated that is converted to electrical energy.

In response to the tip extending towards the second temperature surface, additional stress is induced in the center region of the bi-stable MEMS cantilever. Again, the influence of the tensioner limits bi-stable MEMS cantilever deflection in the center region until the additional stress overcomes the limiting influence of the tensioner. As a result, a change is created in the deflection in the bi-stable MEMS cantilever, with the tip of the bi-stable MEMS cantilever extending towards the first temperature surface in the first stable position.

Additional details of above-described heat harvester and the thermal-to-mechanical-to-electrical energy method are provided below.

BRIEF DESCRIPTION OF THE DRAWINGS

FIGS. 1A and 1B are simplified schematic block diagrams of a hi-stable micro-electrical mechanical system (MEMS) heat harvester.

FIGS. 4A through 4C depict the of heat harvester with thermal expander of FIGS. 3A-3C and a single-piece anchor.

FIG. 5 is a simplified perspective drawing depicting the bi-stable MEMS cantilever further comprising a tip extension connected to the cantilever second end.

FIGS. 6A and 6B are simplified perspective drawings depicting the heat harvester where the thermal expander includes perforations.

FIG. 7 is simplified perspective view of the heat harvester of FIG. 6B without perforations, and including a tip extension.

FIG. 10 is a partial cross-sectional view of a second variation of the heat harvester in greater detail.

FIG. 11 is a partial cross-sectional view of a third variation of the heat harvester in greater detail.

FIG. 20 is a flowchart illustrating a method for converting thermal-to-mechanical-to-electrical energy.

DETAILED DESCRIPTION

Figure 2:
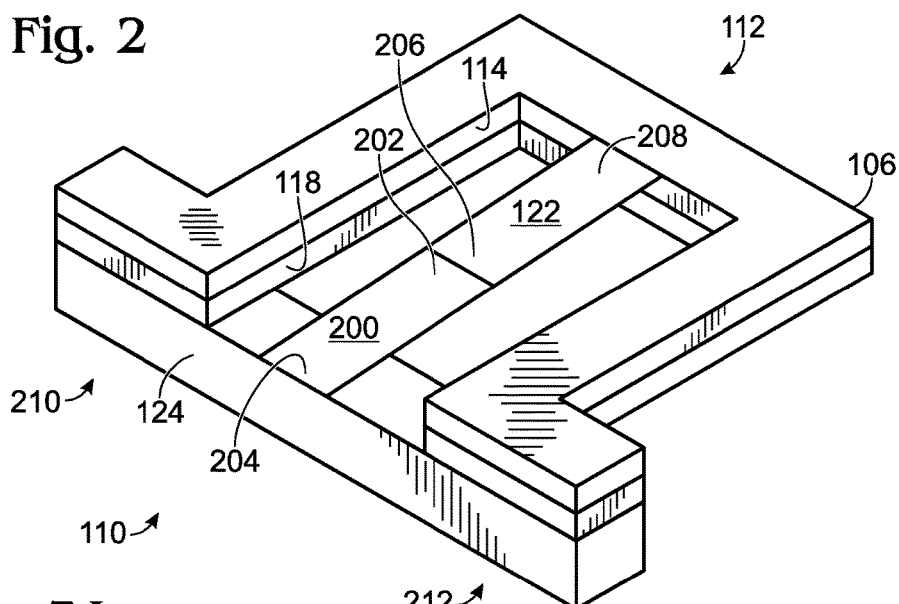
FIG. 2 is a perspective view of a first variation of the heat harvester of FIG. 1A or 1B.

FIGS. 1A and 1B are simplified schematic block diagrams of a bi-stable micro-electrical mechanical system (MEMS) heat harvester. The heat harvester 100 comprises a hot temperature surface 102 having a first temperature and a cold temperature surface 104 having a second temperature less than the first temperature. A bi-stable MEMS cantilever 106 is located in a cavity 108 between the hot temperature surface 102 and the cold temperature surface 104, and has a first end 110 and a second end 112. The bi-stable MEMS cantilever 106 comprises a first MEMS material layer 114 having a first coefficient of thermal expansion. The first MEMS material layer 114 is separated from the hot temperature surface 102 by a first air gap 116. A second MEMS material layer 118 is in contact with the first MEMS material layer 114, and has a second coefficient of thermal expansion less than the first coefficient of thermal expansion. The second MEMS material layer 118 is separated from the cold temperature surface 104 by a second air gap 120.

The heat harvester 100 further comprises a tensioner 122 made from a material having a tensile stress greater than the stress of the first MEMS material layer 114 or second MEMS material layer 118. The tensioner 122 is connected to the cantilever. Typically, the first MEMS material layer 114 and second MEMS material layer 118 have a stress of less than the value resulting from a strain of 0.00001, and the tensioner 122 has a tensile stress that is at least an order of magnitude greater. An anchor 124 secures the first end of the cantilever 110, and is made from a material having a thermal conductivity lower than a thermal conductivity of the first MEMS material layer 114 or tensioner 122 material. The heat harvester also includes a mechanical-to-electrical power converter in a number of configurations. FIG. 1A depicts a mechanical-to-electrical power converter enabled as a piezoelectric device 126, and FIG. 1B depicts the mechanical-to-electrical power converter as an electret device 128. In other aspects, the polarity of the temperature surfaces may be reversed, or they may be aligned vertically. Likewise, as explained in more detail below, the piezoelectric device and electret device may be enabled in a number of configurations. That is, the mechanical-to-electrical power converters may be mounted on the bi-stable MEMS cantilever (FIG. 1A), the hot temperature surface, the cold temperature surface (FIG. 1B), or combinations thereof.

An electret is a dielectric material that has a quasi-permanent electric charge or dipole polarization. An electret generates internal and external electric fields, and is the electrostatic equivalent of a permanent magnet. Piezoelectricity is an electric charge that accumulates in certain solid materials, such as crystals or certain ceramics. The piezoelectric effect is understood as the linear electromechanical interaction between the mechanical and the electrical state in crystalline materials with no inversion symmetry. The piezoelectric effect is a reversible process in that materials exhibiting the direct piezoelectric effect (the internal generation of electrical charge resulting from an applied mechanical force) also exhibit the reverse piezoelectric effect (the internal generation of a mechanical strain resulting from an applied electrical field).

FIG. 2 is a perspective view of a first variation of the heat harvester of FIG. 1A or 1B. In this aspect the hi-stable MEMS cantilever further comprises a thermal expander 200 made from a material having a third coefficient of thermal expansion greater than the second coefficient of thermal expansion. The thermal expander 200 is connected to the tensioner 122. For example, the hi-stable MEMS cantilever 106 may be formed in a "U" shape with two legs 210 and 212, where the ends of the legs form the cantilever first end 110. The thermal expander 200 is shaped as a bar with a first end 202. The thermal expander 200 has a second end 204. The tensioner 122 is shaped as a bar with a first end 206 connected in series to the thermal expander first end 202, and with a second end 208. The combination of thermal expander 200 and tensioner 122 forms a bar connected between the cantilever second end 112 at the center of the "U" shape, and the anchor 124 between the cantilever first end legs.

Figure 3A:
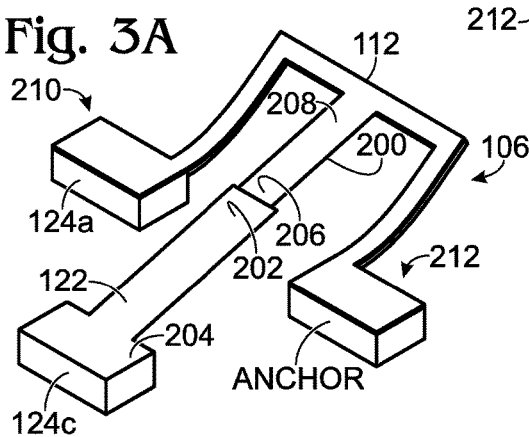
FIGS. 3A through 3C depict simplified variations of heat harvester with thermal expander.
Figure 3C:
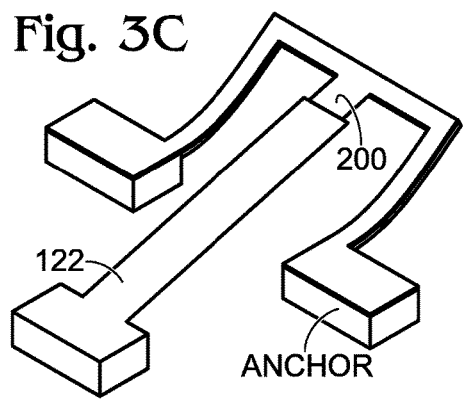
Figure 3B:
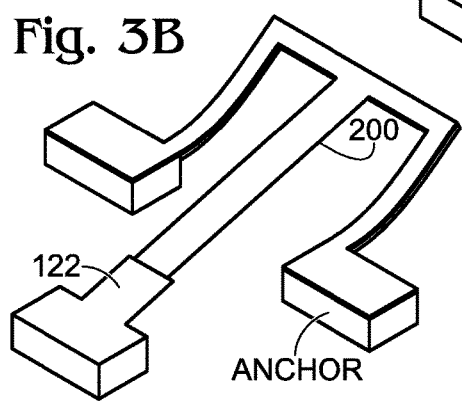

FIGS. 3A through 3C depict simplified variations of heat harvester with thermal expander. For clarity, the temperature surfaces, mechanical-to-electrical power converters, and cantilever layers are not shown. In one aspect, the cantilever first leg 210 is connected to a first anchor 124a and the cantilever second leg 212 is connected to a second anchor 124b. The series-connected thermal expander 200 and tensioner 122 form a bar connected to a third anchor 124c. If the cantilever first and second legs are defined as having a first length, then the thermal expander may have a second length with a dimension less than the first length (FIG. 3C), equal to the first length (FIG. 3A), or greater than the first length (FIG. 3B). As explained in more detail below, the length of the thermal expander can be adjusted to offset longitudinal forces induced by the tensioner that vary over temperature.

FIGS. 4A through 4C depict the of heat harvester with thermal expander of FIGS. 3A-3C and a single-piece anchor. For clarity, the temperature surfaces, mechanical-to-electrical power converters, and cantilever layers are not shown. Again, the bi-stable MEMS cantilever 106 is formed in a "U" shape with two legs 210 and 212, where the ends of the legs form the cantilever first end. The thermal expander 200 is shaped as a bar with a first end 202 and a second end 204. The tensioner 122 is shaped as a bar with a first end 206 connected in series to the thermal expander first end 202. The tensioner 122 has a second end 208. The combination of thermal expander 200 and tensioner 122 form a bar connected to the cantilever second end 112 at the center of the "U" shape. The anchor 124 has a "U" shape with a first end 400 connected to the cantilever first leg 210, a second end 402 connected to the cantilever second leg 212, and a "U" shape center connected to the thermal expander second end 204.

FIG. 5 is a simplified perspective drawing depicting the bi-stable MEMS cantilever 106 further comprising a tip extension 500 connected to the cantilever second end 112. Although not explicitly shown, the tip extension can be added to any of the heat harvester variations depicted in FIG. 1A, 1B, 2, 3-3C, or 4A-4C.

FIGS. 6A and 6B are simplified perspective drawings depicting the heat harvester where the thermal expander 200 includes perforations 600. In FIG. 6A the thermal expander 200 is formed as a bar. Although not explicitly shown, the perforation 600 can be added to any of the heat harvester variations depicted in FIG. 2, 3-3C, 4A-4C, or 5.

In FIG. 6B the thermal expander is formed in a "U" shape with two legs. The hi-stable MEMS cantilever 106 is formed in a bar shape with the first end 110 connected to a first anchor 124a, and a second end 112 connected to the center of the thermal expander "U" shape. The tensioner comprises a first tensioner 122a shaped as a bar connected between a thermal expander first leg 200a and a second anchor 124b. A second tensioner 122b is shaped as a bar connected between a thermal expander second leg 200b and a third anchor 124c.

FIG. 7 is simplified perspective view of the heat harvester of FIG. 6B without perforations, and including a tip extension 500.

Figure 8:
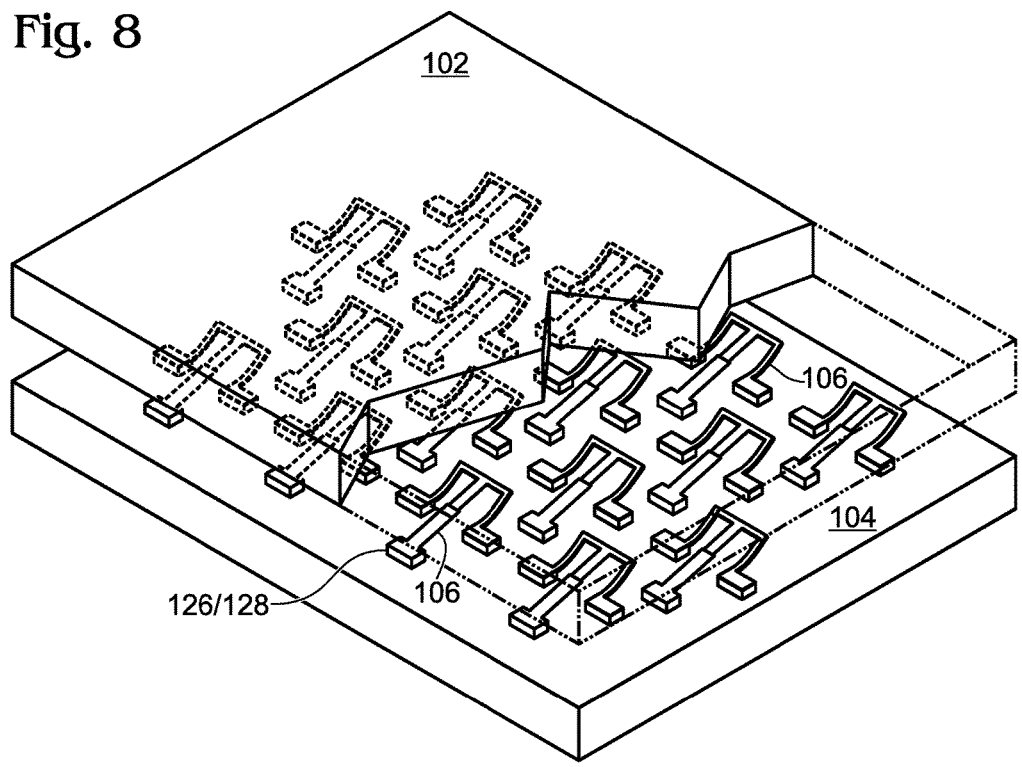
FIG. 8 is a perspective drawing depicting an array with a plurality of bi-stable MEMS cantilevers and a mechanical-to-electrical power converter associated with each cantilever.

FIG. 8 is a perspective drawing depicting an array with a plurality of bi-stable MEMS cantilevers 106 and a mechanical-to-electrical power converter (126 or 128) associated with each cantilever.

Figure 9:
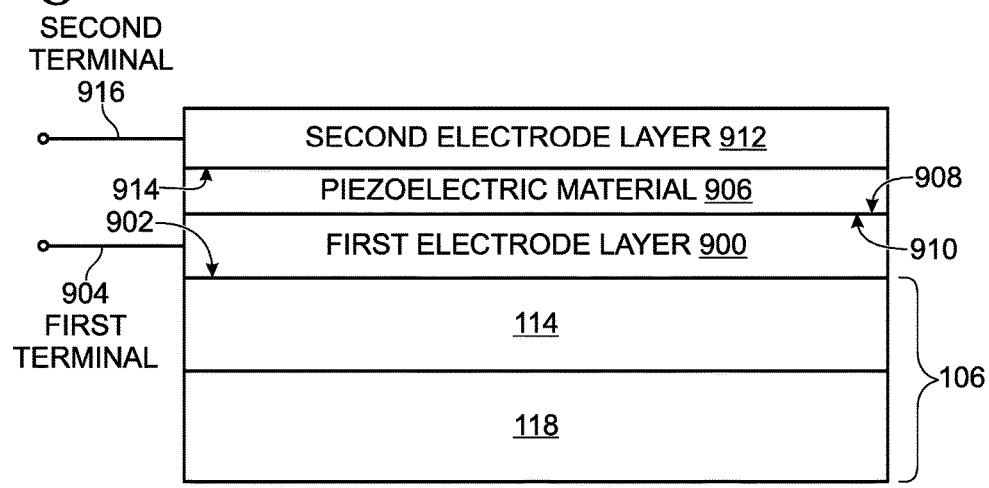
FIG. 9 is a partial cross-sectional view of a first variation of the heat harvester in greater detail.

FIG. 9 is a partial cross-sectional view of a first variation of the heat harvester in greater detail. In the interest of clarity and simplicity, the anchor, temperature surfaces, tensioner, and thermal expander are not depicted. In this case, the mechanical-to-electrical power converter is a piezoelectric device 126 and comprises a first electrode layer 900 having a first surface 902 adjacent to a MEMS material that may be either the first MEMS material 114 or the second MEMS material 118. In the example, the first MEMS material layer 114 is selected. The first electrode layer is connected to a first electrical terminal 904. A piezoelectric material layer 906 has a first surface 908 adjacent to a second surface 910 of the first electrode layer 900. A second electrode layer 912 is adjacent to a second surface 914 of the piezoelectric material layer 906, and is connected to a second electrical terminal 916. If the selected MEMS material layer, in this example MEMS material layer 114, is a metal, then the first electrode layer 900 and selected MEMS material layer comprise a single layer of metal material. Alternatively but not shown, the selected MEMS material layer may be second MEMS material layer 118, and layers 900, 906, and 912 are reversed.

FIG. 10 is a partial cross-sectional view of a second variation of the heat harvester in greater detail. In the interest of clarity and simplicity, the anchor, tensioner, and thermal expander are not depicted. In this case, the mechanical-to-electrical power converter is an electret device and comprises a first electrode layer 1000 having a first surface 1002 adjacent to either the hot temperature surface or the cold temperature surface, and connected to a first electrical terminal 1004. In this example, the cold temperature surface 104 is selected. A first electret layer 1006 is adjacent to a second surface 1008 of the first electrode layer 1000. A second electrode layer 1010 is adjacent to either the first MEMS material layer or the second MEMS material. The selected MEMS material layer is the MEMS material layer further in proximity from the selected temperature surface. So in this example, the selected MEMS material layer is the first MEMS material layer 114. The second electrode layer 1010 is connected to a second electrical terminal 1012. Again, the second electrode layer 1010 and the selected MEMS material layer, in this example layer 114, may comprise a single layer if the material is metal. Alternatively but not shown, if the selected temperature surface is the hot temperature surface, then the selected MEMS material layer would be the second MEMS material layer 118.

FIG. 11 is a partial cross-sectional view of a third variation of the heat harvester in greater detail. To continue the example of FIG. 10, a third electrode layer 1100 has a first surface 1102 adjacent to the unselected temperature surface, and is connected to a third electrical terminal 1104. In this example, the unselected temperature surface is the hot temperature surface 102. A second electret layer 1106 is adjacent to a second surface 1108 of the third electrode layer 1100. A fourth electrode layer 1110 is adjacent to the unselected MEMS material (i.e., layer 118), and is connected to a fourth electrical terminal 1112.

Figure 12:
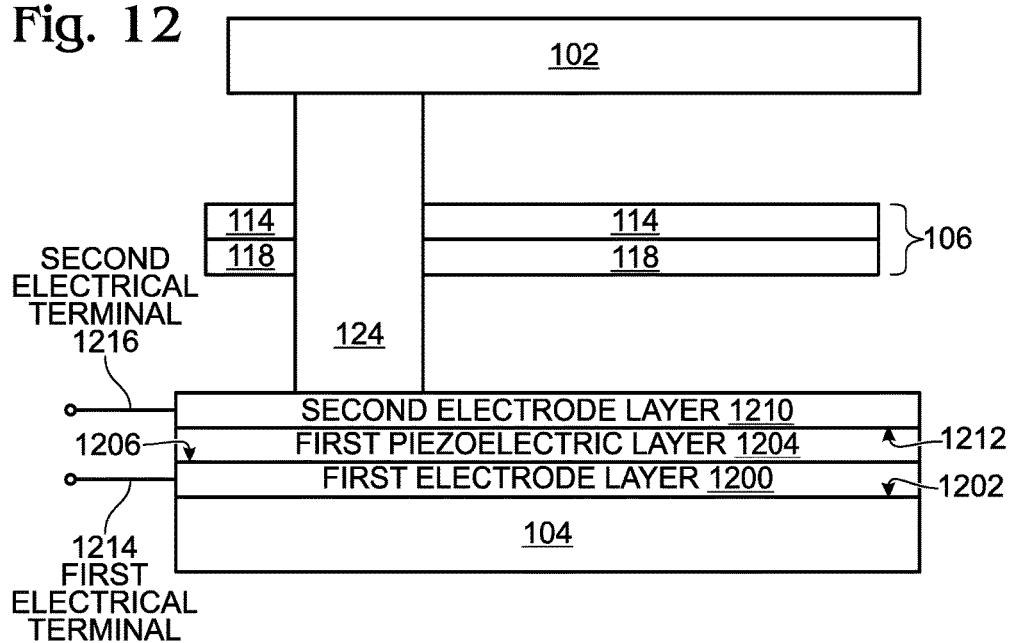
FIG. 12 is a partial cross-sectional view of a fourth variation of the heat harvester in greater detail.

FIG. 12 is a partial cross-sectional view of a fourth variation of the heat harvester in greater detail. In the interest of clarity and simplicity, the anchor, tensioner, and thermal expander are not depicted. A first electrode layer 1200 has a first surface 1202 adjacent to either the hot temperature surface or the cold temperature surface. In this example, the cold temperature surface 104 is selected. The first electrode layer is connected to a first terminal 1214. A first piezoelectric material layer 1204 has a first surface 1206 adjacent to a second surface 1208 of the first electrode layer 1200. A second electrode layer 1210 is adjacent to a second surface 1212 of the first piezoelectric material layer 1204, and is connected to a second terminal 1216. Alternatively, the piezoelectric device may be formed on the hot temperature surface.

Figure 13:
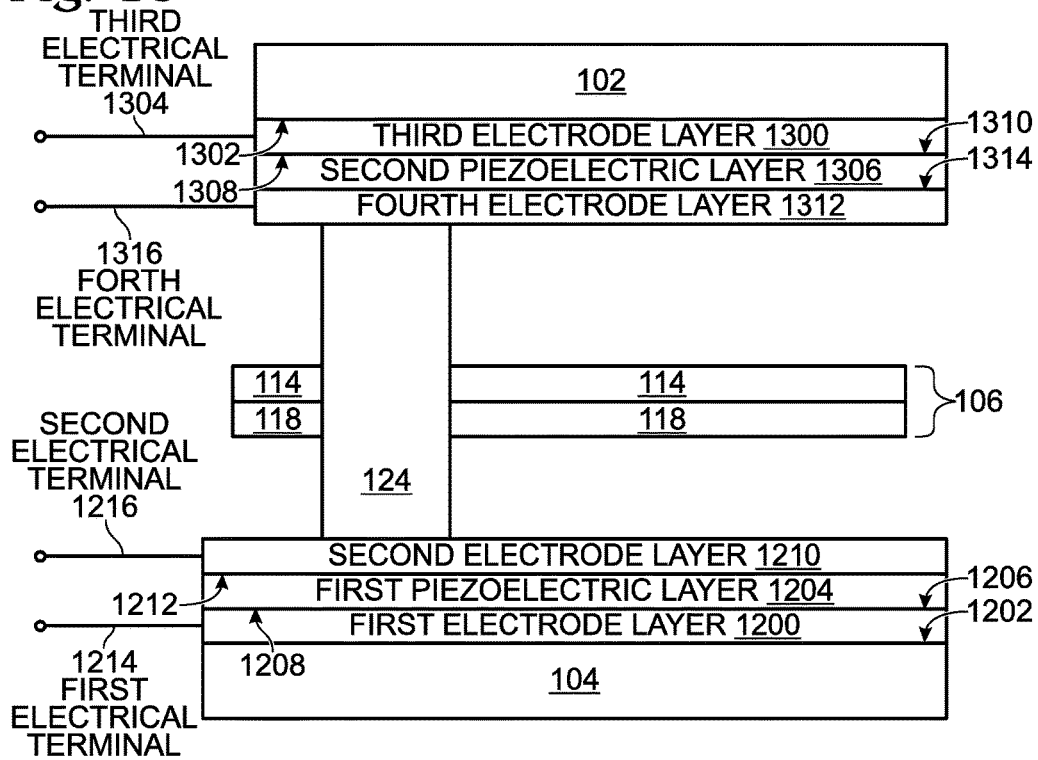
FIG. 13 is a partial cross-sectional view of a fifth variation of the heat harvester in greater detail.

FIG. 13 is a partial cross-sectional view of a fifth variation of the heat harvester in greater detail. Continuing the example of FIG. 12, a third electrode layer 1300 has a first surface 1302 adjacent to the unselected temperature surface (hot temperature surface 102 in this example), and is connected to a third electrical terminal 1304. A second piezoelectric material layer 1306 has a first surface 1308 adjacent to a second surface 1310 of the third electrode layer 1300. A fourth electrode layer 1312 is adjacent to a second surface 1314 of the second piezoelectric material layer 1306, and is connected to a fourth electrical terminal 1316.

Figure 14:
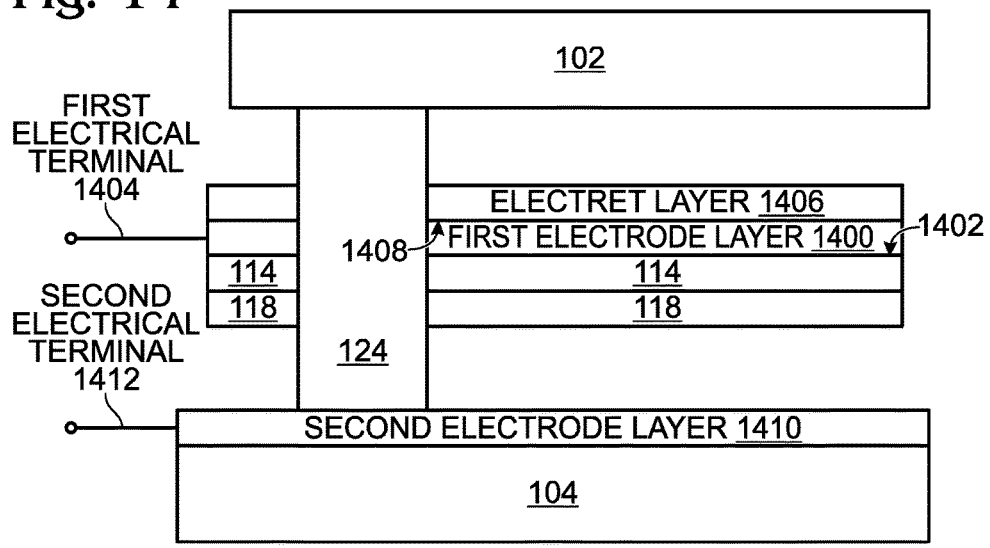
FIG. 14 is a partial cross-sectional view of a sixth variation of the heat harvester in greater detail.

FIG. 14 is a partial cross-sectional view of a sixth variation of the heat harvester in greater detail. A first electrode layer 1400 has a first surface 1402 adjacent to either the first MEMS material layer or the second MEMS material layer, and is connected to a first terminal 1404. In this example, the first MEMS material layer 114 is selected. An electret layer 1406 is adjacent to a second surface 1408 of the first electrode layer 1400. A second electrode layer 1410 is adjacent to the temperature surface that is further in proximity from the selected MEMS material layer, and connected to a second electrical terminal 1412. In this example, the selected temperature surface would be the cold temperature surface 104. Alternatively but not shown, the second MEMS material layer and the hot temperature surface could have been selected. Alternatively but not shown, the first electrode layer can be formed on the second MEMS material layer and the second electrode layer on the hot temperature surface.

Figure 15:
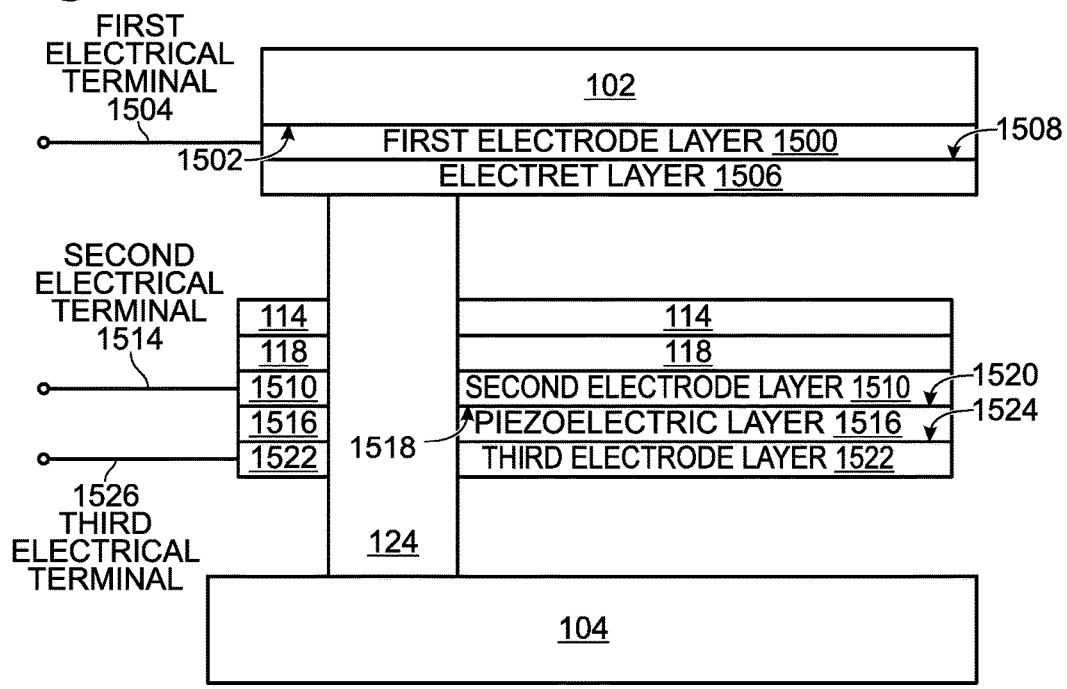
FIG. 15 is a partial cross-sectional of heat harvester in greater detail, depicting both electret and piezoelectric power conversion devices.

FIG. 15 is a partial cross-sectional of heat harvester in greater detail, depicting both electret and piezoelectric power conversion devices. A first electrode layer 1500 has a first surface 1502 adjacent to either the cold temperature surface or the hot temperature surface, and is connected to a first electrical terminal 1504. In this example, the hot temperature surface 102 is selected. An electret layer 1506 is adjacent to a second surface 1508 of the first electrode layer 1500. A second electrode layer 1510 has a first surface 1512 adjacent to the MEMS material layer further in proximity from the selected temperature surface, and is connected to a second electrical terminal 1514. In this example, the second MEMS material layer 118 is selected. A piezoelectric material layer 1516 has a first surface 1518 adjacent to a second surface 1520 of the second electrode layer 1510. A third electrode layer 1522 is adjacent to a second surface 1524 of the piezoelectric material layer 1516, and is connected to a third terminal 1526. The piezoelectric device also comprises the second electrode layer 1510 (i.e., the second electrode layer is common to both the piezoelectric and electret devices). Alternatively but not shown, the selected temperature surface and selected MEMS material layer may be reversed.

Figure 16:
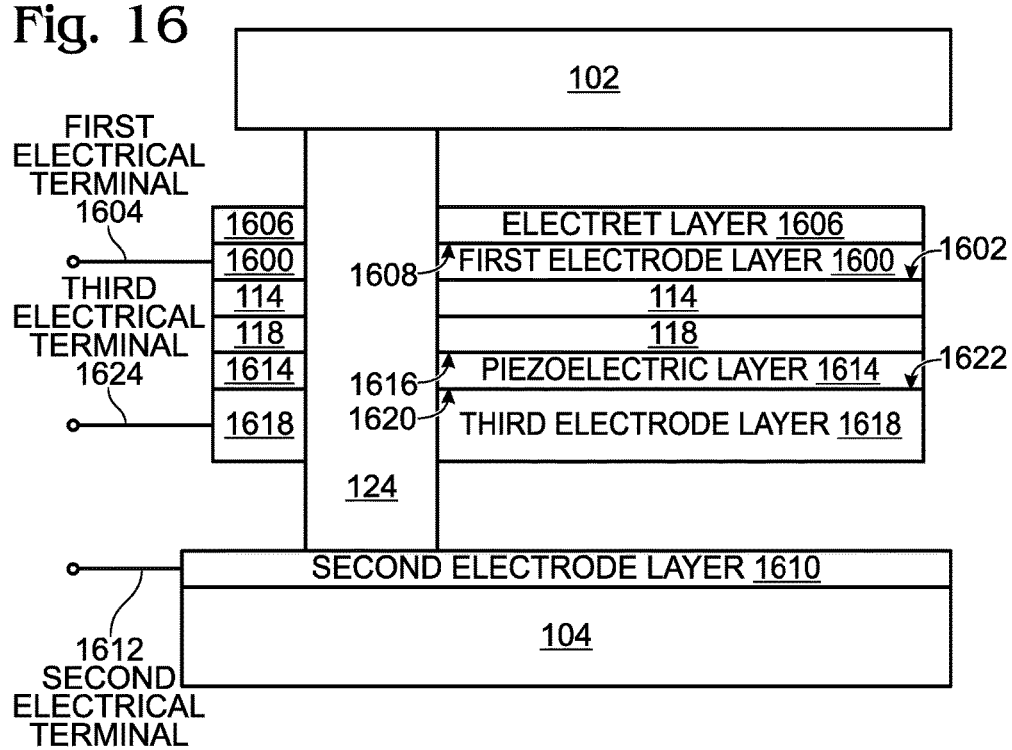
FIG. 16 is a partial cross-sectional of heat harvester in greater detail, depicting another variation using both electret and piezoelectric power conversion devices.

FIG. 16 is a partial cross-sectional of heat harvester in greater detail, depicting another variation using both electret and piezoelectric power conversion devices. A first electrode layer 1600 has a first surface 1602 adjacent to either the first MEMS material layer or the second MEMS material layer, and connected to a first terminal 1604. In this example, the first MEMS material layer 114 is selected. An electret layer 1606 is adjacent to a second surface 1608 of the first electrode layer 1600. A second electrode layer 1610 is adjacent to the temperature surface further in proximity from the selected MEMS material, and connected to a second electrical terminal 1612. In this case, the cold temperature surface 104 is selected. A piezoelectric material layer 1614 has a first surface 1616 adjacent to the unselected MEMS material layer. In this example, the unselected MEMS material layer is the second MEMS material layer 118. A third electrode layer 1618 has a surface 1620 adjacent to a second surface 1622 of the piezoelectric material layer 1614, and connected to a third electrical terminal 1624. The piezoelectric device further comprises the first electrode layer 1600. Alternatively but not shown, the selected MEMS material layer and selected temperature surface may be reversed.

Figure 21A:
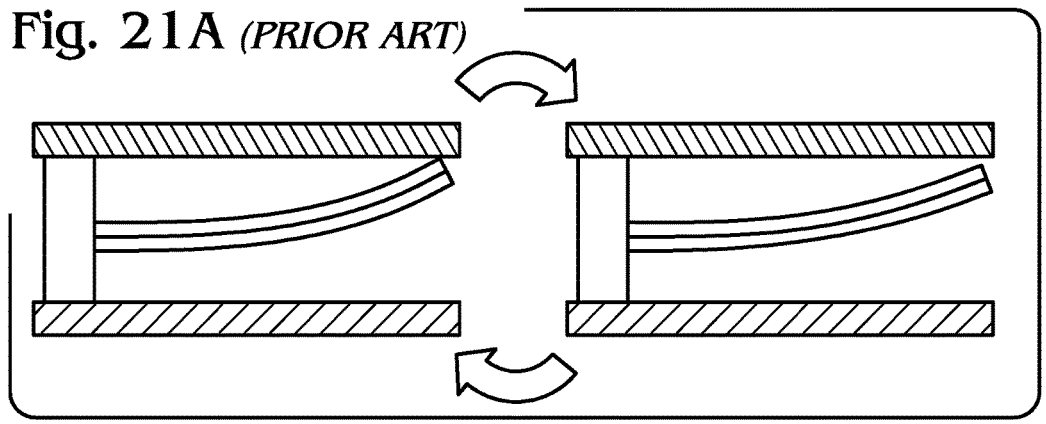
FIGS. 21A and 21B are, respectively, a cross-sectional view of a basic MEMS bimorph cantilever and a strain energy chart (prior art).
Figure 21B:
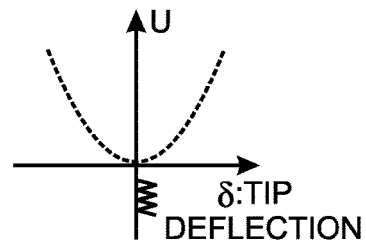
Figure 17:
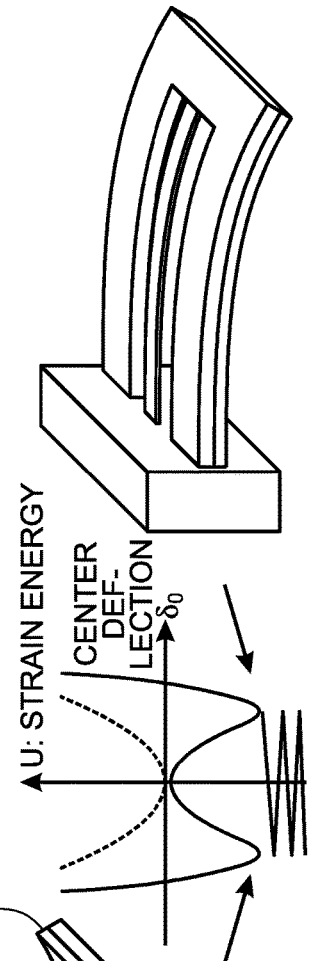
FIG. 17 is a diagram depicting the stable states of a bi-stable MEMS cantilever with an associated strain energy chart.
Figure 18A:
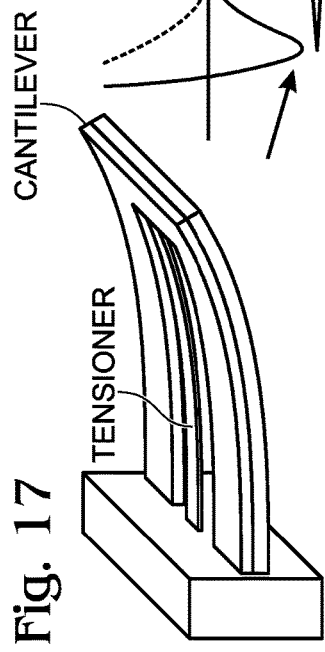
FIGS. 18A through 18D depict the working principle of the bi-stable MEMS cantilever.
Figure 18B:
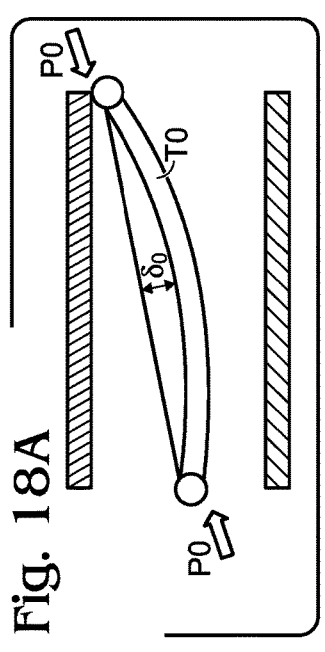
Figure 18C:
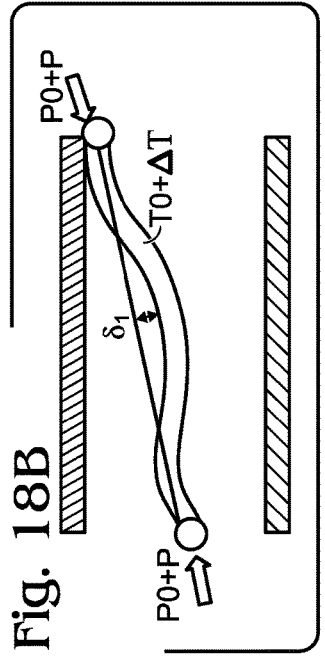
Figure 18D:
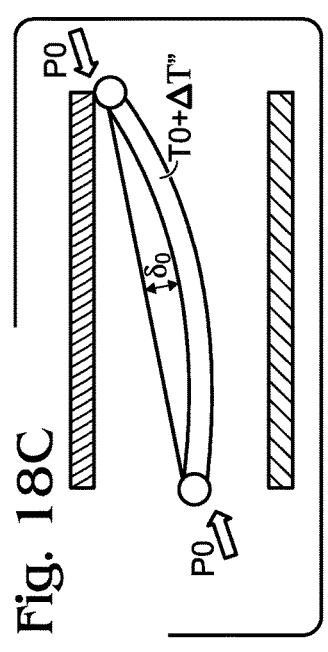

FIG. 17 is a diagram depicting the stable states of a bi-stable MEMS cantilever with an associated strain energy chart. By introducing a bi-stable MEMS cantilever to replace the basic MEMS bimorph cantilever depicted in FIG. 21A, a greater amount of heat energy can be harvested. In addition to a high value coefficient of thermal expansion (CTE) film, a low value CTE film, and a low thermal conductivity material as anchor (the low CTE film and anchor may be the same material), a thin film material with tensile stress is introduced into the system as a tension bar (tensioner). The tension bar is connected to the anchor on one end and to the cantilever tip on another end. This cantilever has two stable positions as shown.

FIGS. 18A through 18D depict the working principle of the bi-stable MEMS cantilever. When the bi-stable MEMS cantilever is arranged between a hot surface and a cold surface, the cantilever vibrates in the following sequence:

1. as the cantilever is first heated, its tip touches the hot surface initially, with a center deflection of $\delta_0$;

$\delta_1$: bi-stable cantilever center deflection;

T0: initial cantilever temperature;

$\Delta T'$: the temperature increase from the initial value of T0, so at T0+$\Delta T'$ the cantilever snaps to its second stable position;

P0: initial tension acting on the cantilever from the tensioner;

P': the tension increase from initial value of P0 after the cantilever snaps to its second stable position;

P: the intermediate tension increase from the initial value of P0 before the cantilever snaps to its second stable position.

2. with the restriction of the tension bar, the cantilever deforms such that its center deflection is reduced and both ends bow up, while maintaining contact between the cantilever tip and the hot surface. The resultant heat is continuously stored as mechanical strain energy in the cantilever;

3. when the induced bending force exceeds the critical tension at the ends of the cantilever, the cantilever suddenly snaps to its second stable position. With its center bowing up and the tip touching the cold surface, the cooling process starts;

4. When the temperature of the cantilever drops to a certain value (determined by the device's physical parameters), the process of Step 3 is reversed. The cantilever quickly snaps to its original first stable position, and its tip touches the hot surface again. The system returns to Step 1, and the next cycle begins.

Figure 19A:
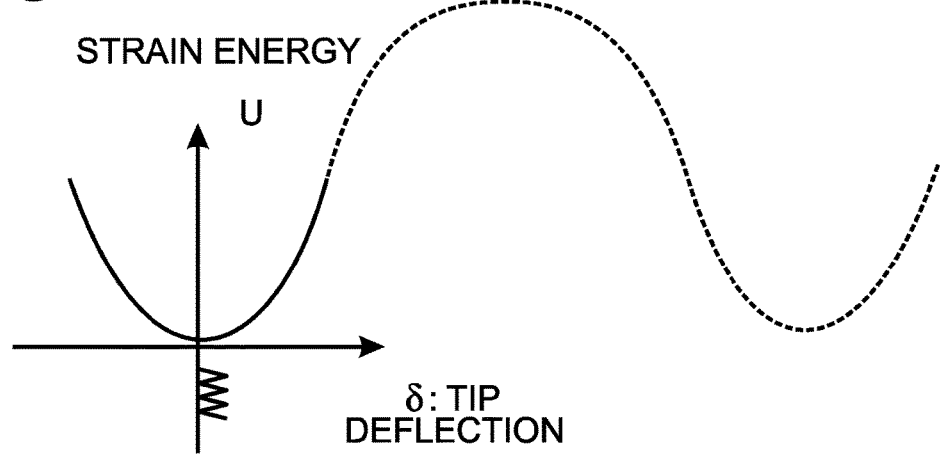
FIGS. 19A and 19B are strain energy charts comparing a conventional bimorph cantilever to a bi-stable cantilever.
Figure 19B:
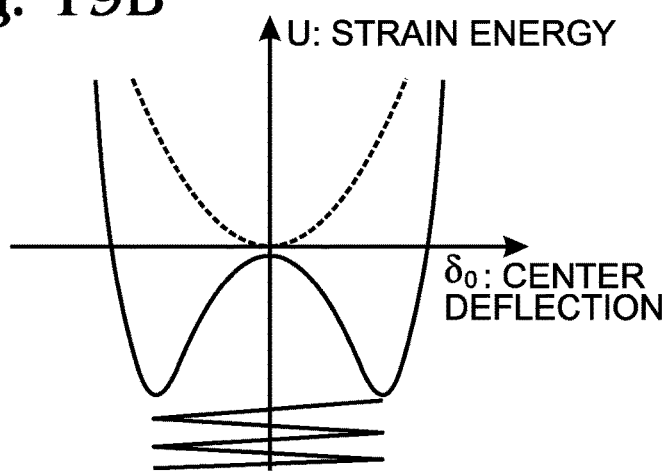

FIGS. 19A and 19B are strain energy charts comparing a conventional bimorph cantilever to a bi-stable cantilever. Although it is theoretically possible for a basic bimorph (or bimetal) cantilever (FIG. 19A) to have two stable positions as plotted with the dashed line, practically it is impossible to reach another stable position because the cantilever can only change its strain energy via its tip contacting the hot surface. As explained above, once there is a small temperature change, the cantilever tip bends down away from the hot surface, and no more stain energy can be gained to overcome the energy barrier to snap to another stable position. As a result, the basic bimorph (or bimetal) cantilever can only vibrate around its original (one) stable position with a very limited displacement and limited strain energy, as shown.

With the bi-stable MEMS cantilever, the tensioner plays a role in enabling the cantilever to vibrate between the two stable positions. Once heated, the tip of the bi-stable cantilever tends to bend from the center. However, the tensile stress in the tensioner restricts the bend. As a result, the cantilever tip is held touching the hot surface and the cantilever is continuously charged with more heat. The cantilever deforms, but in a way that reduces center deflection, while the tip remains in contact with the temperature surface to accumulate additional strain energy. The heating and the strain energy accumulation continues until the energy barrier between the two stable positions has been overcome, and the cantilever then quickly snaps to another stable position. In the second stable position, the cantilever's tip touches the cold surface and the cantilever starts to cool down. The cantilever deforms in the opposite way as it was deformed before the snap. The center deflection is reduced in response to the tensioner, but the strain energy increases again until the energy barrier between the two stable positions has been overcome. Then the cantilever quickly snaps back to its original stable position. As a result, this bi-stable MEMS cantilever vibrates between its two stable positions with very large tip displacement and a significantly higher strain energy, as shown in FIG. 19B.

Clearly, the tensioner not only exerts a compressive force on both ends of the cantilever longitudinally, but also physically fixes the longitudinal span of the cantilever. Mechanically it is equivalent to a cantilever fastened between two fixed support walls (a beam with clamped ends). When heated, two competitive bending moments are induced: one caused by cantilever longitudinal expansion against the "fixed walls", and another is the thermally induced bimorph bending moment that causes snapping. If the bimorph bending moment dominates, then the cantilever vibrates as illustrated in FIGS. 18A-18D. However, if the longitudinal expansion induced bending moment is greater, then the bi-stable MEMS cantilever never snaps to the second stable position because it cannot overcome the strain energy barrier elevated by the longitudinal expansion induced bending moment.

To guarantee bi-stable vibration, a self-adjusting mechanism can be used to exert a preselected fixed level of tension on the bi-stable cantilever to hold the tip in place, charging heat in the cantilever while avoiding an increase in the longitudinal expansion induced bending moment as the cantilever temperature increases.

To serve these requirements, a thermally extendable bar structure may be used, as shown in FIG. 2 for example. An additional segment referred to as a thermal expander may be added in series connection with the tensioner to form a two-segment tension bar with one end connected to the cantilever tip and another end to a spatial offset anchor. The thermal expander may be a different high value CTE material, but can also be the same material as the cantilever's high value CTE layer (first MEMS material layer).

Returning to FIGS. 3A-3C for example, the thermal expander 200 may the same length as the cantilever's legs (FIG. 3A). For simplicity is may be assumed that thermal expander is made from the same material as the cantilever's first MEMS material layer and has zero stress. As fabricated, the tensioner segment exerts a preselected level tension on the cantilever tip through the thermal expander segment. When the cantilever is heated, the thermally expander is heated and expands the same amount as the cantilever legs, resulting in perfect span relaxation from the cantilever tip to its anchor. As a result, there is zero extra bending moment induced due to longitudinal expansion at any temperature and any moment. The cantilever can snap without needing to overcome any extra longitudinal expansion induced bending moment, since the tension exerted on the cantilever tip remains constant at the preselected level of the tensioner.

The snap energy barrier may be lessened by increasing the length of the thermal expander, as shown in FIG. 3B. Again it is assumed that the thermally expander is made of the same material as the cantilever's first MEMS material layer, and has zero stress. The tensioner exerts a preselected level of tension on the cantilever tip through the thermally expander segment. When the cantilever is heated, the longer thermal expander expands more than the cantilever's legs at every temperature. Besides relaxing the span of the cantilever so that no extra bending moment is induced, the gradually increased extra net gain of the thermal expander gradually attenuates the tension level in the tensioner from its original preselected value. In other words, the tension level exerted on the cantilever tip starts at the preselected level as fabricated, and then gradually decreases with an increase of temperature. This over-relaxed approach makes the cantilever snap to its second stable position easier. That is, a smaller temperature change causes the cantilever to vibrate.

FIG. 3C adopts the opposite configuration form the heat harvester of FIG. 3B, with the length of the thermal expander being shorter than the cantilever legs. This is the case between the original fixed-span cantilever (no thermal expander) and the perfectly-relaxed cantilever of FIG. 3A. The tension level exerted on the cantilever tip starts at the preselected level as fabricated, and then gradually increases with an increase is temperature. This under-relaxed approach makes the cantilever snap to its second stable position easier than the original fixed span cantilever, but harder than the cases shown in FIGS. 3A and 3B.

In summary, by adjusting the length of the thermal expander in the two-segment tension bar, a self-adjusting mechanism is enabled to ensure that the cantilever vibrates between its two stable positions with wider range of materials selections and process control tolerance.

Ideally, the heat harvester unit (pixel) vibrates fast due to its very small thermal mass, having micrometer dimensions and a thin film structure. Therefore, it is especially suitable to be scaling up in an arrayed layout using batch fabrication processes. FIG. 8 depicts an example of the heat harvester enabled as a 4×4 arrayed bi-stable MEMS cantilevers with integrated piezoelectric generators (or electrets) on the cantilever legs. Besides integrating the generators on the bi-stable MEMS cantilever, the generator may also be integrated onto the cold surface, the hot surface or on both surfaces. Further, both piezoelectric and electret devices may be formed with each cantilever.

FIG. 20 is a flowchart illustrating a method for converting thermal-to-mechanical-to-electrical energy. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. Generally however, the method follows the numeric order of the depicted steps. The method starts at Step 2000.

Step 2002 provides a heat harvester with a hot temperature surface, a cold temperature surface, an anchored tensioner, and an anchored bi-stable MEMS cantilever comprising two MEMS material layers. Due to a difference in a coefficient thermal expansion between the two MEMS material layers, and the influence of a first temperature surface, Step 2004 induces stress in the hi-stable MEMS cantilever. Step 2006 creates a deflection in the bi-stable MEMS cantilever with a tip of the bi-stable MEMS cantilever extending towards the first temperature surface in a first stable position. Typically, the tip comes in contact with the first temperature surface. In response to the tip extending towards the first temperature surface, Step 2008 induces additional stress in a center region of the bi-stable MEMS cantilever. In response to the influence of the tensioner, Step 2010 limits bi-stable MEMS cantilever deflection in the center region. When the additional stress overcomes the limiting influence of the tensioner, Step 2012 creates a change in the deflection in the bi-stable MEMS cantilever with the tip of the bi-stable MEMS cantilever extending towards the second temperature surface in a second stable position. Typically, the tip comes in contact with the second temperature surface. In response to the change in deflection, Step 2014 generates mechanical energy. Step 2016 converts the mechanical energy to electrical energy.

In response to the tip extending towards the second temperature surface, Step 2018 induces additional stress in the center region of the hi-stable MEMS cantilever. In response to the influence of the tensioner, Step 2020 limits bi-stable MEMS cantilever deflection in the center region. When the additional stress overcomes the limiting influence of the tensioner, Step 2022 creates a change in the deflection in the bi-stable MEMS cantilever with the tip of the bi-stable MEMS cantilever extending towards the first temperature surface in the first stable position.

In one aspect, Step 2002 provides a thermal expander connected to the tensioner. Then, limiting bi-stable MEMS cantilever deflection in the center region in response to the influence of the tensioner (Steps 2010 and 2020) includes the thermal expander automatically acting to modify the influence of the tensioner in response to temperature.

A system and method have been provided for converting thermal energy to mechanical energy, and then to electrical energy. Examples of particular material characteristics and structures have been presented to illustrate the invention. However, the invention is not limited to merely these examples. Other variations and embodiments of the invention will occur to those skilled in the art.

We claim:

1. A bi-stable micro-electrical mechanical system (MEMS) heat harvester, the heat harvester comprising:
 a hot temperature surface having a first temperature;
 a cold temperature surface having a second temperature less than the first temperature;
 a bi-stable MEMS cantilever located in a cavity between the hot temperature surface and the cold temperature surface, having a first end and a second end, the bi-stable MEMS cantilever comprising:
  a first MEMS material layer, having a first coefficient of thermal expansion, separated from the hot temperature surface by a first air gap;
  a second MEMS material layer in contact with the first MEMS material layer, having a second coefficient of thermal expansion less than the first coefficient of thermal expansion, separated from the cold temperature surface by a second air gap;
 a tensioner made from a material having a tensile stress greater than a stress of the first MEMS material layer or the second MEMS material layer, connected to the cantilever;
 an anchor securing the first end of the bi-stable MEMS cantilever, made from a material having a thermal conductivity lower than a thermal conductivity of the first MEMS material layer and tensioner material; and,
 a mechanical-to-electrical power converter.

2. The heat harvester of claim 1 wherein the mechanical-to-electrical power converter is a device selected from a group consisting of a piezoelectric device and an electret device.

3. The heat harvester of claim 1 wherein the bi-stable MEMS cantilever further comprises:
 a thermal expander made from a material having a third coefficient of thermal expansion greater than the second coefficient of thermal expansion, where the thermal expander is connected to the tensioner.

4. The heat harvester of claim 3 wherein the bi-stable MEMS cantilever is formed in a "U" shape with two legs, where the ends of the legs form the cantilever first end;
 where the thermal expander is shaped as a bar with a first end and a second end;
 wherein the tensioner is shaped as a bar with a first end connected in series to the thermal expander first end, and with a second end; and,
 wherein the combination of thermal expander and tensioner form a bar connected between the cantilever second end at the center of the "U" shape, and the anchor between the cantilever first end legs.

5. The heat harvester of claim 4 wherein a cantilever first leg is connected to a first anchor and a cantilever second leg is connected to a second anchor; and,
wherein the series-connected thermal expander and tensioner form a bar connected to a third anchor.

6. The heat harvester of claim 5 wherein the cantilever first and second legs have a first length and the thermal expansion bar has a second length with a dimension selected from a group consisting of less than the first length, equal to the first length, and greater than the first length.

7. The heat harvester of claim 3 wherein the bi-stable MEMS cantilever is formed in a "U" shape with two legs, where the ends of the legs form the cantilever first end;
where the thermal expander is shaped as a bar with a first end and a second end;
wherein the tensioner is shaped as a bar with a first end connected in series to the thermal expander first end, and with a second end; and,
wherein the combination of thermal expander and tensioner form a bar connected to the cantilever second end at the center of the "U" shape; and.
wherein the anchor has a "U" shape with a first end connected to the cantilever first leg, a second end connected to the cantilever second leg, and a "U" shape center connected to the thermal expander second end.

8. The heat harvester of claim 4 wherein the bi-stable MEMS cantilever further comprises a tip extension connected to the cantilever second end.

9. The heat harvester of claim 3 wherein the thermal expander includes perforations.

10. The heat harvester of claim 1 further comprising:
a plurality of bi-stable MEMS cantilevers; and,
a mechanical-to-electrical power converter associated with each cantilever.

11. The heat harvester of claim 3 wherein the thermal expander is formed in a "U" shape with two legs;
wherein the bi-stable MEMS cantilever is formed in a bar shape with the first end connected to a first anchor, and a second end connected to the center of the thermal expander "U" shape; and.
wherein the tensioner comprises a first tensioner shaped as a bar connected between a thermal expander first leg and a second anchor, and a second tensioner shaped as a bar connected between a thermal expander second leg and a third anchor.

12. The heat harvester of claim 2 wherein the mechanical-to-electrical power converter is mounted on a component selected from a group consisting of the hi-stable MEMS cantilever, the hot temperature surface, the cold temperature surface, or combinations thereof.

13. The heat harvester of claim 1 wherein the mechanical-to-electrical power converter comprises:
a first electrode layer having a first surface adjacent to a MEMS material layer selected from a group consisting of the first MEMS material layer or the second MEMS material layer, and connected to a first electrical terminal;
a piezoelectric material layer having a first surface adjacent to a second surface of the first electrode layer; and,
a second electrode layer adjacent to a second surface of the piezoelectric material layer, and connected to a second electrical terminal.

14. The heat harvester of claim 13 wherein the first electrode layer and selected MEMS material layer comprise a single layer of metal material.

15. The heat harvester of claim 1 wherein the mechanical-to-electrical power converter comprises:
a first electrode layer having a first surface adjacent to a temperature surface selected from a group consisting of the hot temperature surface and the cold temperature surface, and connected to a first electrical terminal;
a first electret layer adjacent to a second surface of the first electrode layer; and,
a second electrode layer adjacent to a MEMS material layer selected from a group consisting the first MEMS material layer or the second MEMS material layer, where the selected MEMS material layer is the MEMS material layer further in proximity from the selected temperature surface, and where the second electrode layer is connected to a second electrical terminal.

16. The heat harvester of claim 15 wherein the second electrode layer and selected MEMS material layer comprise a single layer of metal material.

17. The heat harvester of claim 15 further comprising:
a third electrode layer having a first surface adjacent to the unselected temperature surface, and connected to a third electrical terminal; and,
a second electret layer adjacent to a second surface of the third electrode layer; and,
a fourth electrode layer adjacent to the unselected MEMS material layer, and connected to a fourth electrical terminal.

18. The heat harvester of claim 1 wherein the mechanical-to-electrical power converter comprises:
a first electrode layer having a first surface adjacent to a temperature surface selected from a group consisting of the hot temperature surface and the cold temperature surface, and connected to a first terminal;
a first piezoelectric material layer having a first surface adjacent to a second surface of the first electrode layer; and,
a second electrode layer adjacent to a second surface of the first piezoelectric material layer, connected to a second terminal.

19. The heat harvester of claim 18 further comprising;
a third electrode layer having a first surface adjacent to the unselected temperature surface, and connected to a third electrical terminal;
a second piezoelectric material layer having a first surface adjacent to a second surface of the third electrode layer; and,
a fourth electrode layer adjacent to a second surface of the second piezoelectric material layer, and connected to a fourth electrical terminal.

20. The heat harvester of claim 1 wherein the mechanical-to-electrical power converter comprises:
a first electrode layer having a first surface adjacent to a MEMS material layer selected from a group consisting of the first MEMS material layer or the second MEMS material layer, and connected to a first terminal;
an electret layer adjacent to a second surface of the first electrode layer; and,
a second electrode layer adjacent to the temperature surface further in proximity from the selected MEMS material layer, and connected to a second electrical terminal.

21. The heat harvester of claim 1 wherein the mechanical-to-electrical power converter comprises:
an electric power converter comprising:
a first electrode layer having a first surface adjacent to a temperature surface selected from a group consisting of the cold temperature surface and the hot temperature surface, and connected to a first electrical terminal;
an electret layer adjacent to a second surface of the first electrode layer;
a second electrode layer having a first surface adjacent to the MEMS material layer selected as further in proximity from the selected temperature surface, and connected to a second electrical terminal;
a piezoelectric power converter comprising:
a piezoelectric material layer having a first surface adjacent to a second surface of the second electrode layer;
a third electrode layer adjacent to a second surface of the piezoelectric material layer, and connected to a third terminal; and.
the second electrode layer.

22. The heat harvester of claim 1 wherein the mechanical-to-electrical power converter comprises:
an electric power converter comprising:
a first electrode layer having a first surface adjacent to a MEMS material layer selected from a group consisting of the first MEMS material layer or the second MEMS material layer, and connected to a first terminal;
an electret layer adjacent to a second surface of the first electrode layer; and,
a second electrode layer adjacent to the temperature surface further in proximity from the selected MEMS material layer, and connected to a second electrical terminal;
a piezoelectric power converter comprising:
a piezoelectric material layer having a first surface adjacent to the unselected MEMS material layer;
a third electrode layer having a surface adjacent to a second surface of the piezoelectric material layer, and connected to a third electrical terminal; and,
the first electrode layer.

23. A method for converting thermal-to-mechanical-to-electrical energy, the method comprising:
providing a hot temperature surface, a cold temperature surface, an anchored tensioner, and an anchored bi-stable micro-electrical mechanical system (MEMS) cantilever comprising two MEMS material layers;
due to a difference in a coefficient thermal expansion between the two MEMS material layers, and the influence of a first temperature surface, inducing stress in the bi-stable MEMS cantilever;
creating a deflection in the hi-stable MEMS cantilever with a tip of the bi-stable MEMS cantilever extending towards the first temperature surface in a first stable position;
in response to the tip extending towards the first temperature surface, inducing additional stress in a center region of the bi-stable MEMS cantilever;
in response to the influence of the tensioner, limiting bi-stable MEMS cantilever deflection in the center region;
when the additional stress overcomes the limiting influence of the tensioner, creating a change in the deflection in the bi-stable MEMS cantilever with the tip of the bi-stable MEMS cantilever extending towards the second temperature surface in a second stable position;
in response to the change in deflection, generating mechanical energy; and,
converting the mechanical energy to electrical energy.

24. The method of claim 23 further comprising:
in response to the tip extending towards the second temperature surface, inducing additional stress in the center region of the bi-stable MEMS cantilever;
in response to the influence of the tensioner, limiting bi-stable MEMS cantilever deflection in the center region; and,
when the additional stress overcomes the limiting influence of the tensioner, creating a change in the deflection in the bi-stable MEMS cantilever with the tip of the bi-stable MEMS cantilever extending towards the first temperature surface in the first stable position.

25. The method of claim 23 further comprising:
providing a thermal expander connected to the tensioner; and.
wherein limiting bi-stable MEMS cantilever deflection in the center region in response to the influence of the tensioner includes the thermal expander automatically acting to modify the influence of the tensioner in response to temperature.

* * * * *